Sept. 5, 1967 R. R. DION ET AL 3,340,438

ENCAPSULATION OF ELECTRONIC MODULES

Filed April 5, 1965

2 Sheets-Sheet 1

INVENTORS

REGINALD R DION

JOSEPH A. BENENATI

CHARLES P. COUGHLIN

ROBERT E. MORRIS

BY Mengo D. Young

ATTORNEY

Sept. 5, 1967 R. R. DION ET AL 3,340,438

ENCAPSULATION OF ELECTRONIC MODULES

Filed April 5, 1965 2 Sheets-Sheet 2

United States Patent Office 3,340,438

Patented Sept. 5, 1967

3,340,438

ENCAPSULATION OF ELECTRONIC MODULES

Reginald R. Dion and Joseph A. Benenati, Beacon, Robert E. Morris, La Grangeville, and Charles P. Coughlin, Chelsea, N.Y., assignors to International Business Machines Corporation, New York, N.Y., a corporation of New York Filed Apr. 5, 1965, Ser. No. 445,339
3 Claims. (Cl. 317—101)

This invention relates to encapsulating means for electronic modules and more particularly to the encapsulation and process for encapsulating modules containing microelectronic and integrated circuitry.

Electronic circuits in data processing systems are formed of extremely small active and passive circuit elements placed very close together in order to minimize signal coupling and translation times as well as the overall physical size of the unit. Particular technology directed to this end comprises fabrication of circuitry referred to as integrated circuitry wherein the various elements and conductive leads are formed by diffusing particular dopants of different types of conductivity into a layer of a semiconductor material such as silicon or germanium. Particular methods for forming transistors and other elements in this manner are described in the literature. It is, of course, practical to form certain elements such as capacitors and inductances according to standard printed circuit techniques and it is then necessary to form connections between the diffused elements and printed elements. A particular manner in which this may be done is disclosed in copending patent application of Edward M. Davis, Jr., and Arthur H. Mones, Ser. No. 300,723, filed Aug. 8, 1963, now Patent No. 3,156,124, and assigned to the same assignee as this present application. With such methods, one may form a plurality of various logic circuits, oscillators and the like as required in a data processing system. In order to provide a convenient means of assembling such circuits, the respective individual circuits are packaged in modular form for assembly of a plurality of such modules on circuit boards and the like.

While the technology of integrated circuitry is complex, production costs thereof can be minimized such that a major portion of such cost is related to the packaging of the circuitry. This is particularly true when hermetically sealed packages are employed to protect the surfaces of active elements from water vapor and other vapors to which such surfaces are electrically sensitive as well as to protect the circuit structure from corrosive vapors.

Furthermore, the components of integrated circuit technology are of extremely small size, of an order to tens of mills, and the electrical connections thereto are of much smaller dimensions which require extreme care in the handling and packaging. For example, standard epoxy coatings cannot be employed in packaging such elements since the epoxy contracts upon hardening thereby lifting the particular component away from its connection to the contact leads on the module.

In addition to the fragileness of the contacts between the components, integrated or otherwise, the respective circuits themselves must be protected from physical damage that will be inevitable in the handling of the components either during the replacement thereof in the field or during the manufacturing process. In order to isolate active surfaces of particular semiconductor elements or the entire integrated circuit itself, a layer of insulative material such as glass is placed over those surfaces which layer may be easily broken by almost any physical impact resulting in the shorting out of that component.

It is then an object of the present invention to provide improved encapsulation for electronic circuitry of the integrated structure type.

Another object of the present invention is to provide improved encapsulation for integrated type circuitry to prevent corrosion due to exposure to the atmosphere without requiring a hermetic seal.

Still another object of the present invention is to provide encapsulation of integrated type circuitry which provides physical protection therefor as well as preventing exposure to the atmosphere without the requirement of a hermetic seal.

It is still another object of the present invention to provide an improved package that allows various electronic circuits of integrated structure type to be connected to one another.

It is still another object of the present invention to provide a package encapsulation for electronic circuits of an integrated structure type, which encapsulation may be readily assembled by mass production techniques.

It is still another object of the present invention to provide an improved method of encapsulating electronic circuits of an integrated structure type.

In addition to the requirements of an encapsulation that it protect the respective circuitry from exposure to corrosive atmospheres as well as protection against physical impact, the encapsulation system should be of such a nature as to provide flexibility in the accommodation of circuits of different sizes and complexities without requiring major changes in the production processes. To provide such flexibility as well as ease in assembly, one or more ceramic plates are provided in a stacked module configuration upon which plates the circuit elements or integrated circuit structures may be mounted with conductive support pins being provided through and between the respective plates for connection to the respective circuits. An inert non-stress conformal coating is placed over the circuitry on each of the respective plates to protect the respective circuitry from moisture and the like. A metal cover is adapted as to accommodate insertion of the module therein after which the cover is crimped to hold it in place with the assembly being secured with a rubber back seal. When it is desired to encapsulate a module consisting of circuits on more than one ceramic plate, only minor adjustments of the process and tooling need be made including an increase of the depth of the metal cover.

The metal cover is provided with outwardly diverging sidewalls for ready assembly with the individual modules prior to crimping and sealing and both the module and cover are of a rectangular configuration to allow for maximum use of the area of a circuit card into which a plurality of such encapsulated modules are to be inserted to form the final circuit package.

A particular feature then by which increased lifetime of electronic circuitry of integrated type structure is achieved resides in encapsulation in the form of at least one ceramic plate upon which the circuitry is mounted, an inert stress free conformal coating placed over the circuitry, a metal cover placed over the circuitry with the ceramic plate being crimped in place and a rubber back seal to secure the package.

A specific feature resides in the particular metal cover configuration which allows for ready assembly and moisture sealing without the requirement of the hermetic seal.

These and other objects, advantages and features will be more readily understood from a review of the following specification when taken in conjunction with the drawings wherein.

Figure 2:
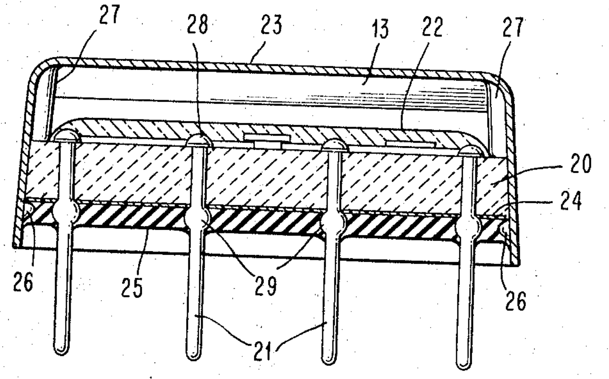
FIGURE 2 is a cross sectional view of an encapsulated module having a single ceramic plate.
Figure 3A:
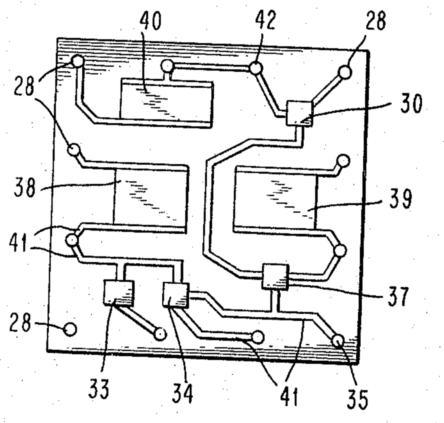
Figure 3B:
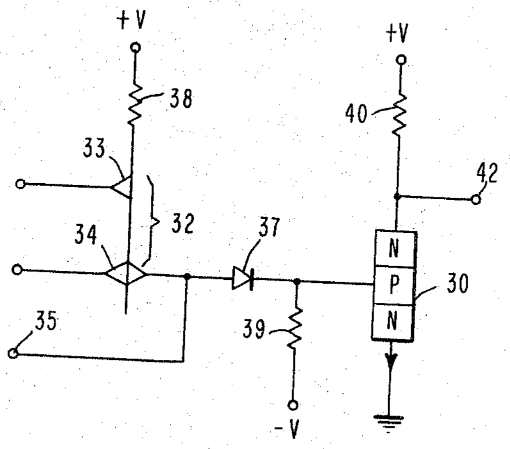
Figure 4:
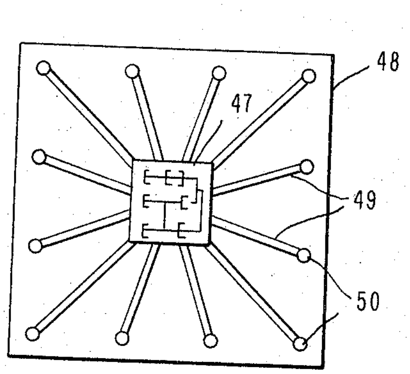
Figure 5:
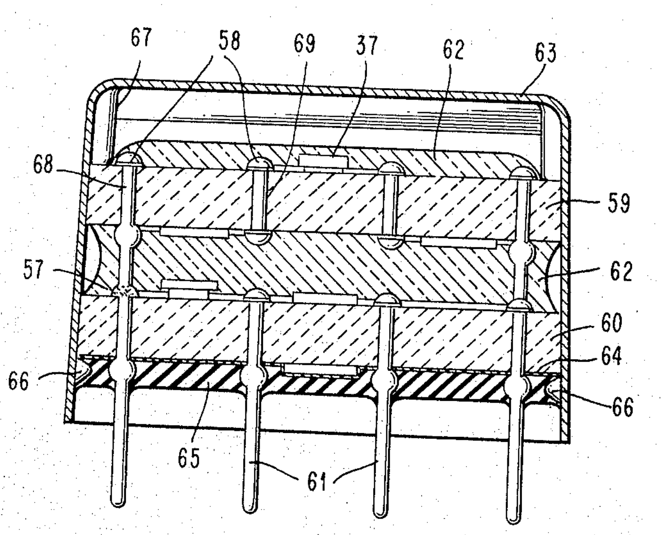
Figure 6:
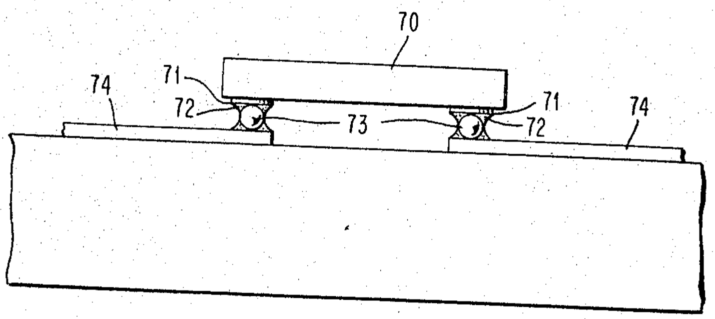

FIGURE 3*a* is a plan view illustrating an integrated circuit such as might be employed in the module of FIGURE 2;

FIGURE 3*b* is a schematic diagram of the circuit embodiment of FIGURE 3*a*;

FIGURE 4 is a plan view of a monolithic circuit structure as mounted on the ceramic plate such as employed in FIGURE 2;

FIGURE 5 is a cross sectional view of an encapsulated module similar to that shown in FIGURE 2 except that at least two ceramic plates are employed; and FIGURE 6 is a cross sectional view illustrating the manner in which an integrated circuit structure or a single planar transistor may be mounted on the ceramic substrate.

Figure 1:
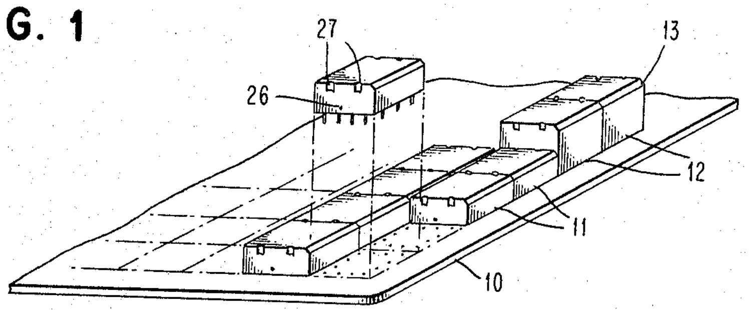
FIGURE 1 is a pictorial view illustrating the arrangement of a plurality of encapsulated modules of the present invention as mounted on a circuit board.

FIGURE 1 is illustrative of the advantages of modular design in packaging. In FIGURE 1 there is shown integral circuit board 10 which may be employed with a plurality of encapsulated modules of the present invention mounted thereon. As employed in the present invention, the respective modules may be of a size of approximately ½ inch on the side with each module containing an average of three or four logic circuits when a single ceramic plate is employed. When a stacked module is employed, the number of logic circuits involved may be two or three times as many. In this manner, an 8½" x 11" circuit board can be provided with anywhere from 1000 to 5000 logic circuits depending upon the number of circuits required. The respective interconnections between module pins may be printed on the underside of circuit board 10 in a conventional manner. Two forms of modules of the present invention are shown in FIGURE 1. Modules 11 are formed of a single encapsulated plate and modules 12 are of the encapsulated stacked module type. The metal cover of each of the respective modules if provided with chamfered edge 13 with which the respective circuitry and terminal pins of the module are oriented for proper insertion in circuit board 10.

A cross section of an encapsulated module is shown in FIGURE 2 which illustrates the specific details of the present invention. A typical circuit is illustrated in physical form in FIGURE 3*a* which is a plan view of the module shown in FIGURE 2. In schematic form, the circuitry of the module of FIGURE 3*a* is illustrated in FIGURE 3*b* and comprises an AND/OR inverter circuit including transistor inverter 30. Diode gate 32 formed by diodes 33 and 34 to form the AND function of input signals thereto and diode 37 are so connected as to provide the OR function of the output of gate 32 and the input signal supplied to terminal 35. Gate 32 is coupled to a positive voltage bias by resistor 38 and the base of transistor 30 is coupled to a negative voltage bias by resistor 39. The emitter of transistor 30 is grounded and the collector thereof is connected to a positive voltage bias through resistor 40 and also to output terminal 42. The corresponding, active and passive elements are to be noted in FIGURE 3*a* with the appropriate electrical connections therebetween according to the schematic of FIGURE 3*b* being accomplished by conductive lands 41. It will be understood that any logic circuit may be adapted for employement with the present invention.

A particular method by which such a circuit may be formed is described in the above-referred-to copending application according to which the respective conductor lands and resistors are applied by screen printing with the respective active diodes and transistor being added thereto as will be more thoroughly described below. After such a circuit has been formed on ceramic plate 20, a conformal non-stress coating 22 is applied over this circuit and the module is inserted into metal cover 23. Cover 23 is provided with four indentations 27 to position ceramic plate 20 relative to the cover after which cover 23 is crimped or indented as indicated at 26. With the ceramic plate thus fastened to cover 23, the assembly then may be turned upside down with pins 21 extending upwardly and primer coat 24 is applied to the exposed surface to adapt it to receive backseal 25 such as a silicone rubber, the properties of which will be more thoroughly described below.

In order to accommodate connection between the respective conductive lands and the circuit board into which the module is plugged, pin terminals 21 are inserted in apertures spaced close to the outer edge of ceramic plate 20 after which a mechanical force is applied to expand the metal above and below the ceramic plate so as to secure it thereto. After the pins have been placed, a dip solder process is employed to coat the conductive pattern on the ceramic plate with solder and make connection to terminal pins 21. The solder does not adhere to the resistors which are provided with a glaze protective coating or to the surface of the alumina plate which is not wetted by the solder. After coating of the conductive pattern on one surface of the module, the module is then solder dipped on the pin terminal side for ease in making connection with the printed circuit boards. This process is more thoroughly described in the above-referred-to copending application.

The manner in which the individual active components are secured to their erspective conductive lands is illustrated in FIGURE 6 wherein active component 70 is provided with respective contact surfaces 71 to which have been attached respective solder mounds 72 and balls 73 of a conductive material such that when the active element is positioned over the conductive lands 74 as illustrated in FIGURE 6 and heated to an appropriate temperature, a solder reflow will be effected with the resulting configuration being as indicated in FIGURE 6. When an integrated circuit of the monolithic type structure as indicated in FIGURE 4 is to be encapsulated, similar means of connecting the structure to the conductive lands may be employed.

Although module plate 20 may be formed of other ceramic materials, a composition of at least 94% to 99% alumina is preferred because of its high thermoconductivity, excellent electrical insulative properties and stability at high temperatures. The preferred respective coating materials are of the silicone type which is here defined to be a linear dimethyl siloxane polymer although other material may be used. Conformal coating 22 is required to be a chemical inert gel like material that does not harden to stress the active elements at temperatures in which the module is to be used. This conformal nonstress material may be formed of a basic resin, a thinner and a curing agent. The basic resin preferably is a linear dimethyl siloxane polymer the chains of which have vinyl groups attached. The curing agent preferably is a linear dimethyl siloxane polymer, the chains of which are terminated by silane groups. The thinner then should be a linear dimethyl siloxane polymer, the chains of which have no active groups attached but the thinner should contain a small percentage of a platinic catalyzing agent preferably a chloroplatinate resulting in an amount of platinum of one part per million. The proportions of the resin, thinner and curing agent are respectively 100:50:10.

After curing, the silicone gel should be characterized by a chemical inertness of no more than 10 parts per million of ionizable material and a pH of 7.0±0.5. With the above referred to ratios of resin, thinner and curing agent, a minimal rigidity is obtained. An appropriate measure of rigidity is a penetration test where a 19.5 gram load presenting a surface 0.25 inch in diameter is brought to bear on the gel having bulk dimensions of approximately 2 inches in diameter and 3.5 inches in thickness. When this load is supported by the gel for 5 seconds, penetration thereof should be measured at 17–23 millimeters.

A particular material that may be employed as the conformal non-stress coating is manufactured and sold by the Dow Corning Corporation under the trademark "Sylgard." In order to allow the material to spread evenly over all the components on the module, the module is first heated to a temperature of approximately 150° C. at the time the conformal coating is applied. Primer coat 24 and the silicone rubber are applied without any heat treatment although the curing step for the rubber is according to a preferred process as will be more thoroughly described below.

The silicon rubber is also of the dimethyl siloxane polymer type. After curing this rubber should have a durometer hardness of approximately 60 with a variation of no more than +10 or −5. Such a rubber that may be employed is one that results from the condensation of silanol terminated polymethylsiloxane groups with tetraethylorthosilicate. To catalyze the reaction, some water vapor should be present and a dibutyl tin dilaurate is added in the amount of approximately 0.2%–0.5% by weight. Such rubbers may be obtained commercially.

The primer material is formed of a silicone with a volatile carrier base and includes the following percentages by weight of materials:

| | Percent |
|---|---|
| Acetone | 34 |
| Isopropyl alcohol | 28 |
| Butyl alcohol | 4 |
| Toluene | 19 |
| Silicone | 13 |

The respective percentages may be varied providing the percentage of silicone is maintained in the range of 12%–18%.

After the primer is applied, it is allowed to set for one to two hours at room temperature in an atmosphere of 50% relative humidity. The silicone rubber backseal is then applied and cured for two to ten hours at room temperature with a relative humidity of 50%, then for one hour at 40° C. and ambient humidity, then for one hour at 65° C. and 60% relative humidity, and finally for two to three hours at 160° C. and ambient humidity. This process has been found to provide the optimum curing and debubbling of the backseal.

When it is desired to package an integrated circuit of a monolithic type, the circuit wafer may be positioned on the alumina plate with contacts made to the respective conductive lands much in the same manner as are the active elements of the circuits shown in FIGURE 3. A monolithic circuit module is illustrated in FIGURE 4 and the encapsulation process and end result will be the same as that described in relation to FIGURE 2.

In FIGURE 4, conductive lands 49 are printed on ceramic plate 48 and pins 50 are inserted and affixed to plate 48 in the same manner as were pins 21 affixed to plate 20 in FIGURE 2. Both surfaces of plate 48 are then dip soldered and monolithic circuit wafer 47 is attached to the respective conductive lands 49 in the manner described in reference to FIGURE 6, the conductive land topology being chosen for alignment with the particular contact surfaces of wafer 47.

When it is desired to provide encapsulation for a more complex circuitry, a module of two or more substrates may be formed such as indicated in FIGURE 5. As shown therein, connective pins 61 and 68 are provided for ceramic plates 60 and 59, respectively, in the same manner as are the connective pins of the ceramic module 20 of FIGURE 2. The top surfaces of both ceramic plates 59 and 60 are again provided with conductive lands and active elements, such as transistors, diodes and the like. In addition, the lower surfaces of the ceramic plates may be provided with passive elements, such as resistors, capacitors and to this end interconnecting pins 69 are provided to make contact between the active elements on one surface and the passive elements on the other. In one manner in which contact between the respective ceramic plates may be made, the ends of terminal pins 61 are provided with solder mounds 57 such that when pins 68 are placed thereon and the entire assembly brought to appropriate temperature, there will result a solder reflow forming the connection. It will be understood that prior to this operation both surfaces of ceramic plates 59 and 60 have been solder dipped to coat the conductive surfaces both of the conductive lands and pins 61 and 68. After the stacked module has been formed, the non-conformal stress coating material 62 which is the same as material 22 of FIGURE 2 is deposited on the top surface of ceramic plate 59 and also between plates 59 and 60, as illustrated in FIGURE 5, after which the assembly is inserted into metal cover 63 and then primer coat 64 and silicone rubber backseal 65 are applied to the bottom surface of ceramic plate 60 in the manner similar to that described in relation to FIGURE 2. Cover 63 is provided with indentations 67 to position the stacked module therein after which cover 63 is indented at 66 to secure the assembly in manner similar to that described in relation to FIGURE 2.

With the encapsulation of the present invention, electronic modules are provided which in life tests have a failure rate as small as 0.05% per thousand hours per module which is an improvement over other forms of encapsulation of microelectronic circuitry by as much as a factor of 100, even though the encapsulation does not provide a hermetic seal for the circuitry. This is of particular importance when it is remembered that although microelectronic and integrated circuitry are popular and desirable for many uses, such use has been impractical in the commercial field because of relatively high failure rates and the requirement of often replacement of the individual module. It is this impracticality that has been a barrier to widescale usage of such circuitry in the commercial fields of data processing and the like. While the encapsulation of the present invention does not provide perfect hermetic seal, it does serve to prohibit exposure of the circuit elements to water vapor which may effect their electrical properties as well as to various corrosive vapors that may be encountered.

While encapsulation devices of the prior art have generally been so designed as to provide a hermetic seal for the respective electrical components, such hermetic seals are expensive to fabricate resulting in an undue increase in cost of the encapsulated module. While the protective seal of the present invention cannot be said to be hermetic especially in the sense that it is impervious to hydrogen or helium gas; nevertheless, it does provide extremely good protection against water vapors and noxious industrial vapors, such as sulphur and acetic acid, which vapor might either cause corrosion of the respective elements or effect the electrical properties of the active elements which are very surface sensitive.

While the present invention has been particularly shown and described with reference to preferred embodiments, it will be understood by those skilled in the art that changes and modifications in form and details may be made without departing from the spirit and scope of the present invention.

What is claimed is:

1. An encapsulated package having circuitry performing particular electronic functions, said package comprising:
   - a substrate of an inert material having a plurality of apertures extending therethrough,
   - a plurality of conductive pins, each of which is inserted in a particular one in said apertures,
   - a microelectronic circuit mounted on at least one surface of said substrate including conductive lands mounted on said surface and connected to said conductive pins, at least one resistor of a printed thin film of resistive material associated with said lands, and at least one semiconductor device having at least two contact elements which are joined to said conductive lands,
   - a conformal coating of a nonstress chemically inert silicone gel deposited over said surface and covering said microelectronic circuit, a metallic cover having a configuration adapted to receive said substrate and into which said substrate is inserted with said microelectronic circuit residing in the interior thereof, said cover being indented at particular points to secure said cover to said substrate, and a back seal layer of cured rubber-type material disposed over the surface of said substrate opposite said one surface on which said semiconductor is mounted, said back seal extending completely over said opposite surface and into contact with the walls of said metal cover so as to prevent water vapor and other noxious industrial vapors from penetrating into the region of said microelectronic circuit,

2. An encapsulated electronic package according to claim 1 wherein said nonstress chemically inert silicone gel includes the cured product of (1) a linear dimethyl siloxane polymer, the chains of which have vinyl groups attached, and (2) a linear dimethyl siloxane polymer, the chains of which are terminated by silane groups.

3. The encapsulated package of claim 1 wherein the package includes a plurality of substrates with the pins of the upper substrates joined to the upper surface of the lower substrate, and said conformal coating of nonstress chemically inert silicone gel is disposed between the substrates and on the upper surface of the upper substrate.

References Cited

UNITED STATES PATENTS

| | | | |
|---|---|---|---|
| 2,961,350 | 11/1960 | Flaschen et al. | 174—52 |
| 3,052,822 | 9/1962 | Kilby. | |
| 3,239,595 | 3/1966 | Reese et al. | 174—52 |
| 3,257,621 | 6/1966 | Jadoul | 174—52 |

OTHER REFERENCES

IBM Technical Disclosure Bulletin, vol. 6, No. 10, March 1964, pp. 70, 71.

Electronic Industries, June 1964, p. 67.

ROBERT K. SCHAEFER, *Primary Examiner.*

W. C. GARVERT, J. R. SCOTT, *Assistant Examiners.*